(12) United States Patent
Moriura et al.

(10) Patent No.: US 9,853,174 B2
(45) Date of Patent: Dec. 26, 2017

(54) PHOTOELECTRIC CONVERSION ELEMENT

(71) Applicant: Panasonic Intellectual Property Management Co., Ltd., Osaka (JP)

(72) Inventors: Yuta Moriura, Osaka (JP); Hitoshi Ishimoto, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 11 days.

(21) Appl. No.: 14/649,538

(22) PCT Filed: Nov. 18, 2013

(86) PCT No.: PCT/JP2013/006754
§ 371 (c)(1),
(2) Date: Jun. 3, 2015

(87) PCT Pub. No.: WO2014/087586
PCT Pub. Date: Jun. 12, 2014

(65) Prior Publication Data
US 2015/0318417 A1  Nov. 5, 2015

(30) Foreign Application Priority Data

Dec. 7, 2012 (JP) ................ 2012-267931
Dec. 7, 2012 (JP) ................ 2012-267932

(51) Int. Cl.
*H01L 31/0236* (2006.01)
*H01L 51/44* (2006.01)
(Continued)

(52) U.S. Cl.
CPC ...... *H01L 31/02366* (2013.01); *H01L 51/441* (2013.01); *H01L 51/447* (2013.01);
(Continued)

(58) Field of Classification Search
CPC ............. H01L 31/02366; H01L 51/424; H01L 51/4253; H01L 51/426; H01L 51/441;
(Continued)

(56) References Cited

U.S. PATENT DOCUMENTS 5,482,570 A * 1/1996 Saurer ................ H01G 9/2036
136/255
2003/0230337 A1 * 12/2003 Gaudiana ............. H01G 9/2031
136/256
(Continued)

FOREIGN PATENT DOCUMENTS

JP  59-198781  11/1984
JP  7-326780   12/1995
(Continued)

OTHER PUBLICATIONS

International Search Report of PCT application No. PCT/JP2013/006754 dated Jan. 14, 2014.
(Continued)

*Primary Examiner* — Matthew Martin
(74) *Attorney, Agent, or Firm* — McDermott Will & Emery LLP

(57) ABSTRACT

A photoelectric conversion element includes a first electrode layer, a photoelectric conversion layer, and a second electrode layer. The first electrode layer includes a first base member, and a rough layer formed on the first base member. The photoelectric conversion layer is formed on the rough layer, and the second electrode layer is formed above the photoelectric conversion layer. The rough layer includes a plurality of metal fine particles irregularly connected together and to a surface of the first base member, and the photoelectric conversion layer infiltrates among the plurality of metal fine particles constituting the rough layer.

10 Claims, 2 Drawing Sheets

(51) Int. Cl.
*H01L 51/52* (2006.01)
*H01L 51/00* (2006.01)

(52) U.S. Cl.
CPC ...... *H01L 51/5225* (2013.01); *H01L 51/0037* (2013.01); *H01L 51/0038* (2013.01); *H01L 51/0039* (2013.01); *Y02E 10/549* (2013.01)

(58) Field of Classification Search
CPC . H01L 51/442; H01L 51/447; H01L 51/5225; H01L 51/0037; H01L 51/00387; H01L 51/0039
USPC .......................................................... 136/263
See application file for complete search history.

(56) References Cited

U.S. PATENT DOCUMENTS

| | | | | |
|---|---|---|---|---|
| 2005/0247340 | A1* | 11/2005 | Zeira | H01L 51/0005 136/263 |
| 2009/0260675 | A1* | 10/2009 | Erdemli | H01L 31/048 136/251 |
| 2011/0226322 | A1* | 9/2011 | Lee | H01L 31/02168 136/256 |
| 2012/0313129 | A1 | 12/2012 | Zettsu et al. | |
| 2013/0269766 | A1* | 10/2013 | Park | H01L 51/4213 136/256 |

FOREIGN PATENT DOCUMENTS

| | | |
|---|---|---|
| JP | 2005-310388 | 11/2005 |
| JP | 2006-245074 | 9/2006 |
| JP | 2010-251592 | 11/2010 |
| WO | 2011/065358 | 6/2011 |
| WO | 2013/151142 | 10/2013 |

OTHER PUBLICATIONS

A. Fujiki et al. "Enhanced fluorescence by surface plasmon coupling of Au nanoparticles in an organic electroluminescence diode", Applied Physics Letters, vol. 96, No. 4 (2010), 043307.

The Journal of Physical Chemistry C, 2007, 111, 16640-16645.

* cited by examiner

PHOTOELECTRIC CONVERSION ELEMENT

TECHNICAL FIELD

The present invention relates to a photoelectric conversion element.

BACKGROUND ART

In order to use renewable energy, development of technology using a photovoltaic effect becomes increasingly important. As a result of such development of technology, improvement of a photoelectric conversion element is advanced. The photoelectric conversion element includes an electricity-generating type element which converts light into electrical energy, and a light-emitting type element which, on the contrary, converts electrical energy into light. Both types of elements have substantially the same structure, but they use different materials for a layer disposed between electrodes. The former uses a photoelectric conversion material to form an electricity-generating type element, and the latter uses a light-emitting material to form a light-emitting type element.

Typical examples of the former include solar cells, while typical examples of the latter include light-emitting diodes. The solar cells include inorganic solar cells and organic solar cells. Examples of the inorganic solar cells include crystalline (polycrystalline) silicon solar cells and amorphous silicon solar cells, both made of silicon, CIGS (Copper Indium Gallium Diselenide) solar cells using a compound semiconductor. Along with expansion of the solar cell market, low-cost and high-performance solar cells have been demanded. On the other hand, examples of the organic solar cells include organic thin-film solar cells. Since the solar cells of this type use dye and polymers as raw material, material costs are low. Furthermore, since a printing technique by, for example, coating can be used, the manufacturing process is facilitated, and thus, the cost can be largely reduced and the area can be increased.

The conversion efficiency of an organic thin-film solar cell has been improved by mixing a p-type semiconductor as a donor material and an n-type semiconductor as an acceptor material with each other to form a bulk hetero layer. In particular, it is desired to increase the P-N junction interface.

FIG. 5 is a sectional view of a conventional photoelectric conversion element (a type of converting light into electrical energy). The photoelectric conversion element includes base member 11, first electrode layer 13 formed on base member 11, photoelectric conversion layer 14, and second electrode layer 17. Furthermore, in order to improve the conversion efficiency, development of a technique for increasing a surface area of first electrode layer 13 and a technique for improving efficiency by a surface plasmon effect has been also carried out actively.

On the other hand, in an organic EL element as one type of the light-emitting diode, in order to improve the performance, a study for improving electron injection efficiency by forming asperities on an electrode surface, a study for enhancing light-emitting efficiency by interaction with a light-emitting body neighboring an electrode by resonance with the surface plasmon, are carried out actively.

Note here that prior art information relating to the invention of the present application includes, for example, PTLs 1 to 3 and NPLs 1 and 2.

CITATION LIST

Patent Literature

PTL 1: Japanese Patent Unexamined Publication No. 2006-245074
PTL 2: Japanese Patent Unexamined Publication No. 2005-310388
PTL 3: Japanese Patent Unexamined Publication No. S59-198781

Non-Patent Literature

NPL 1: J. Phys. Chem. C 2007, 111, 16640-16645
NPL 2: Appl. Phys. Lett. 96, 043307 (2010)

SUMMARY OF THE INVENTION

A photoelectric conversion element of the present invention has a first electrode layer, a photoelectric conversion layer, and a second electrode layer. The first electrode layer includes a first base member and a rough layer formed on the first base member. The photoelectric conversion layer is formed on the rough layer, and the second electrode layer is formed above the photoelectric conversion layer. The rough layer includes a plurality of metal fine particles irregularly connected together and to a surface of the first base member, and the photoelectric conversion layer infiltrates among connected bodies each formed of the plurality of metal fine particles.

This configuration can increase an electrode area of the photoelectric conversion element, and improve mechanical strength of the electrode itself and that of an interface between the electrode and the base member. Furthermore, a surface plasmon effect can be controlled by forming the thin rough layer of the metal particles and the property can be improved.

DESCRIPTION OF EMBODIMENTS

Figure 5:
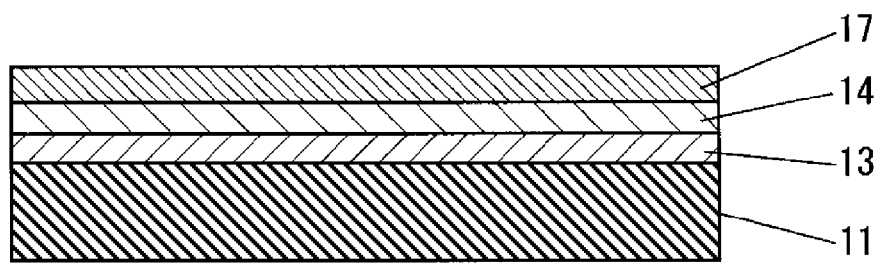
FIG. 5 is a schematic sectional view of a conventional photoelectric conversion element.

Prior to the description of the exemplary embodiments of the present invention, problems in a conventional photoelectric conversion element are described. When a conventional photoelectric conversion element shown in FIG. 5 is formed, second electrode layer 17 that is a transparent electrode layer, photoelectric conversion layer 14, and first electrode layer 13 as a counter electrode are formed sequentially in this order.

According to NPL 1, in order to improve the conversion efficiency, it is desirable that a surface area of first electrode layer 13 per apparent area for receiving and emitting light be increased (i.e., a surface area be enlarged). Since first electrode layer 13 is formed on base member 11, in general, high temperature treatment of oxide or the like is required to be carried out on base member 11. Accordingly, the types of base member 11 are limited. Therefore, there is a problem that a flexible substrate is used as base member 11 and the surface area thereof is enlarged while first electrode layer 13 is formed thereon.

PTL 3 describes formation of asperities on a surface, which is brought into contact with a photoelectric conversion layer of an electrode layer by vapor deposition. However, the vapor deposition is a complicated process and undergoes various restrictions. Furthermore, as in PTL 3, in a structure in which asperities are formed in an island shape, it is difficult to further enlarge the surface area.

In NPL 1 and PTL 2, oxide is formed as first electrode layer 13. In such a case, mechanical strength of an electrode layer itself, and mechanical strength of an interface between the electrode layer and the base member are small.

As mentioned above, it is difficult for the conventional photoelectric conversion elements to obtain sufficient mechanical strength while the surface of the first electrode layer is enlarged. In particular, when a photoelectric conversion element is formed on a flexible substrate, these problems are remarkable.

The following is a description, with reference to drawings, of a photoelectric conversion element in which a surface area of an electrode is enlarged, surface plasmon absorption or surface plasmon loss is reduced, and mechanical strength of the electrode itself and that of an interface between the electrode and a base member are increased in accordance with exemplary embodiments of the present invention. Note here that the same numerals are given to the same configurations as those of the proceeding exemplary embodiments and detailed description thereof may be omitted.

First Exemplary Embodiment

Figure 1:
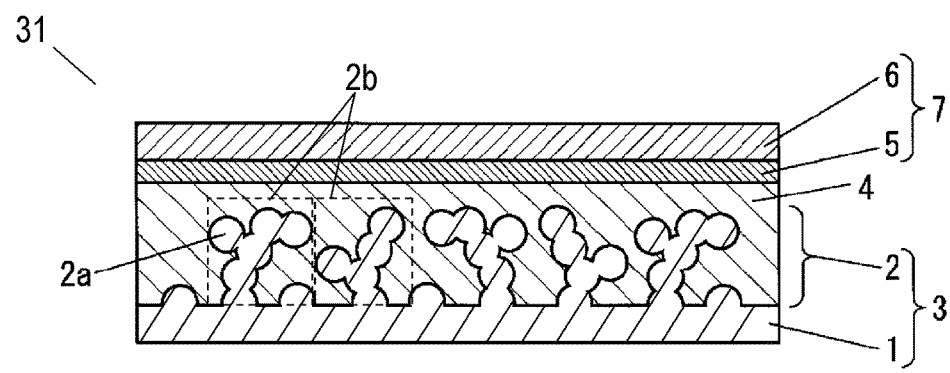
FIG. 1 is a schematic sectional view of a photoelectric conversion element in accordance with a first exemplary embodiment of the present invention.

FIG. 1 is a schematic sectional view of photoelectric conversion element 31 in accordance with a first exemplary embodiment of the present invention. Photoelectric conversion element (hereinafter, referred to as element) 31 has first electrode layer 3 having conductivity, photoelectric conversion layer (hereinafter, referred to as conversion layer) 4, and second electrode layer 7. First electrode layer 3 includes first base member 1 having conductivity and rough layer 2 formed on first base member 1. Conversion layer 4 is formed on rough layer 2 so as to cover the whole surface of first base member 1. Second electrode layer 7 is formed on conversion layer 4. Element 31 can convert light into electrical energy.

Rough layer 2 includes a plurality of metal fine particles 2a irregularly connected together and to a surface of first base member 1. Furthermore, when first electrode layer 3 is taken out alone, rough layer 2 has a large number of pores inside thereof. Accordingly, conversion layer 4 infiltrates among connected bodies 2b each formed of the plurality of metal fine particles 2a. Second electrode layer 7 includes conductive layer 5 formed on conversion layer 4, and second base member 6 formed on conductive layer 5.

In element 31, when light enters second electrode layer 7, positive holes (holes) and electrons are generated in conversion layer 4. The positive holes move in the thickness direction of conversion layer 4 and are extracted from conductive layer 5, and the electrons are extracted from first electrode layer 3.

Hereinafter, each configuration of such an element 31 is described. Firstly, first electrode layer 3 is described. As mentioned above, first electrode layer 3 plays a role of an electrode (electron-extraction electrode) for extracting electrons generated in conversion layer 4. Since light enters second electrode layer 7, first electrode layer 3 is not necessarily required to be transparent.

Rough layer 2 includes a plurality of connected bodies 2b each formed of a plurality of metal fine particles 2a irregularly connected together and extending from the surface of first base member 1. Each of connected bodies 2b is a structure body which diverges into a plurality of branches but does not have an acute angle portion. Therefore, as mentioned above, when first electrode layer 3 is taken out alone, rough layer 2 has a large number of pores inside thereof. Since these pores communicate to the outside, the surface area is increased by these pores.

Note here that each connected body 2b may be formed by stacking metal fine particles 2a having substantially the same particle diameter, or having different particle diameters at random. Alternatively, metal fine particles 2a having a larger particle diameter may be disposed at a bottom portion, and metal fine particles 2a having a smaller particle diameter may be disposed at a tip portion. With such a configuration, adhesion between metal fine particles 2a and first base member 1 can be enhanced while the large surface area can be maintained.

For example, first base member 1 is an aluminum foil having high purity with a thickness of 10 to 50 μm, and a main component of metal fine particle 2a is also aluminum. Besides, first base member 1 and metal fine particle 2a can be formed of various metals such as an aluminum alloy, gold, silver, copper, titanium, niobium, and tantalum. However, it is preferable that both first base member 1 and metal fine particle 2a are made of aluminum having a relatively low melting point. When rough layer 2 includes aluminum, excellent productivity is achieved in production by, for example, a vapor deposition method.

First base member 1 may be a conductive polymer film, a transparent conductive glass, or the like. First base member 1 may be formed as a base member provided with a film having conductivity on an insulating member. That is to say, first base member 1 only needs to have conductivity.

Furthermore, the main components of rough layer 2 and first base member 1 may be different from each other, but the main components thereof are preferably the same metal. When such material is selected, first base member 1 is appropriately softened by heat at the time of the vapor deposition. Thus, bonding between first base member 1 and metal fine particles 2a can be strengthened while a shape of first base member 1 is maintained.

As mentioned above, it is preferable that first base member 1 has conductivity. However, first base member 1 may only function as a base member for supporting rough layer 2. In that case, first base member 1 may not have conductivity. In this configuration, rough layer 2 has an electrically conducting function of the first electrode layer.

Rough layer 2 can be formed by the following procedures.

(1) First base member 1 is disposed in a vapor deposition chamber, which is kept in a vacuum condition of 0.01 to 0.001 Pa.

(2) The surrounding of first base member 1 is infused with inert gas including oxygen gas and argon gas whose flow amount is 2 to 6 times larger than that of oxygen gas so that the pressure around first base member 1 is 10 to 30 Pa.

(3) The temperature of first base member 1 is kept in a range from 150 to 300° C.

(4) Rough layer 2 is formed by vacuum vapor deposition in a state in which aluminum is set at a vapor deposition source.

Note here that in the above-mentioned step (2), the vapor deposition may be carried out without infusing oxygen gas and argon gas.

Rough layer 2 can be formed by the above-mentioned process. It is preferable that a thickness of rough layer 2 is, for example, 5 nm or more and 10.0 µm or less. The thickness of rough layer 2 of 5 nm or more allows the surface area of first electrode layer 3 to be increased. Furthermore, when rough layer 2 is extremely thin, sheet resistance becomes too large. The thickness of rough layer 2 of 10.0 µm or less allows light which enters second base member 6 to easily reach conversion layer 4.

Note here that in the above description, vapor deposition is described as an example of the process for forming rough layer 2. However, any other techniques may be used as long as a loose structure body in which a plurality of metal fine particles 2a are connected to each other and gaps are formed among metal fine particles 2a. For example, rough layer 2 may be formed by etching the surface of first base member 1.

The average particle diameter of metal fine particles 2a is preferably nm or more and 300 nm or less, and, for example, about 100 nm. That is to say, the mode of the diameter of metal fine particles 2a is 5 nm or more and 300 nm or less. When the average particle diameter is less than 5 nm, the connection portion between metal fine particles 2a become extremely thin, so that the mechanical strength may become weak. On the contrary when the average particle diameter is more than 300 nm, it becomes difficult to increase the surface area. In order to maintain the mechanical strength, the diameter of the connection portion of metal fine particles 2a is preferably 30% or more with respect to the particle diameter of metal fine particles 2a.

Furthermore, in a state of first base member 1 alone, the mode of the pore diameter of rough layer 2 is preferably 5 nm or more and 1 µm or less. It is preferable that the pore diameter of rough layer 2 is extremely fine as such. The pore diameter of rough layer 2 can be calculated by a mercury intrusion method, using the following mathematical formula (1).

$$D = -4\gamma \cos\theta / P \quad (1)$$

where P is pressure applied to fill a pore with mercury. D is a pore size (diameter), $\gamma$ is the surface tension of mercury (480 dyne·cm$^{-1}$), and $\theta$ is a contact angle between mercury and the pore wall surface. The mode of the pore diameter is a peak value of the distribution of the pore diameter D.

Furthermore, in a state of first base member 1 alone, the porosity of rough layer 2 ranges from about 50% to 80%. The porosity can be obtained by calculation of the weight and volume of rough layer 2 and the true density of the vapor deposition material.

Note here that, as shown in FIG. 1, rough layer 2 is composed of connected bodies 2b each in which a plurality of metal fine particles 20 are bonded to each other. Thus, in the section along the vertical direction (stacking direction), a large number of connection portions exist among metal fine particles 2a. This may make it difficult to measure the diameter of individual particles. In that case, the image-processing of scanning electron microscope (SEM) photographs of metal fine particles 2a in the horizontal section of the particles facilitates the measurement of the average particle diameter of metal fine particles 2a.

As mentioned above, rough layer 2 is formed of a plurality of metal fine particles 2a of, for example, aluminum, connected together and extending from first base member 1 toward the surface layer. Accordingly, it is possible to achieve the increase in the electrode area, and to increase a contact interface with conversion layer 4 formed on the surface of rough layer 2, thus improving the interface reliability. In addition, it is preferable that each connected body 2b is formed to diverge into a plurality of branches. Thus, the electrode area is further increased and the contact interface with conversion layer 4 is increased.

Next, conversion layer 4 is described. Conversion layer 4 is formed so as to cover the whole surface of rough layer 2 formed on first base member 1 as shown in FIG. 1. Conversion layer 4 contributes to charge separation of element 31, and has a function of transporting the generated electrons and positive holes to first electrode layer 3 and second electrode layer 7, which are opposite directions, respectively.

Conversion layer 4 is shown as a single layer having both an electron acceptor function and an electron-donor function. However, an electron acceptor layer having an electron-acceptor function and an electron donor layer having an electron-donor function may be laminated to form conversion layer 4. Hereinafter, an example of conversion layer 4 made of a single layer is described.

Conversion layer 4 contains an electron donor material and an electron acceptor material. Accordingly, since charge separation occurs by using a P-N junction formed in conversion layer 4, photoelectric conversion can be carried out by conversion layer 4 alone. The electron donor material is not particularly limited as long as it has a function as an electron donor. Also, the electron acceptor material is not particularly limited as long as it has a function as an electron acceptor. Preferably, however, these materials are conductive polymer materials. Use of conductive polymer materials permits film formation by a wet coating method. Thus, a photoelectric conversion element having a large area can be manufactured at a low cost.

In particular, it is preferable that poly3-hexylthiophene (P3HT) is used as a p-type organic semiconductor, and a fullerene derivative such as [6.6]-phenyl-C61-butyric acid methyl ester (PCBM) is used as an n-type organic semiconductor. These materials are blended with each other, so that a photoelectric conversion layer called a bulk hetero type can be formed.

A thickness of conversion layer 4 preferably falls in a range generally employed in a bulk hetero type photoelectric conversion element. Specifically, in order to cover the whole part of rough layer 2, the thickness of conversion layer 4 is preferably larger than the thickness of rough layer 2. Therefore, it is preferable that the thickness of conversion layer 4 is in the range of 5 nm or more and 10.0 µm or less.

A mixing ratio of the electron donor material and the electron acceptor material is appropriately adjusted at an optimum ratio depending upon the types of materials to be used.

A method for forming conversion layer 4 is not particularly limited as long as it can uniformly form conversion layer 4 to have a predetermined thickness. Among such methods, a wet coating method is preferably used. The wet coating method permits formation of conversion layer 4 in the atmosphere, thus enabling the cost reduction and the increase in an area. That is to say, conversion layer 4 can be formed by, for example, a die coating method, a spin coating method, a dip coating method, a roll coating method, a spray coating method, a gravure coating method, an ink-jet method, a screen printing method, and the like.

Next, second electrode layer 7 is described. Conductive layer 5 constituting second electrode layer 7 is formed on conversion layer 4, and formed of a conductive material. In particular, it is preferable to use a light-transmitting conductive material made of metal oxides such as indium tin oxide (ITO). Such conductive layer 5 can be formed by various methods such as a coating method, a sputtering method, and an electrolytic polymerization method. Furthermore, conductive layer 5 through which light can pass may be formed of a mesh structure using metal particles.

On the other hand, it is preferable that second base member 6 is formed of a transparent material because it acts as a light-receiving surface. The transparent material is not particularly limited, and the examples thereof include transparent rigid members such as quartz glass and synthetic quart plate, which do not have flexibility, or transparent flexible members such as a transparent resin film and an optical resin plate, which have flexibility. Furthermore, second electrode layer 7 does not necessarily cover the whole surface of element 31, and it may have, for example, a mesh shape. In this case, second electrode layer 7 is not necessarily required to be formed of a transparent material. That is to say, second electrode layer 7 may be formed of a metal mesh wiring electrode or a metal nanowire electrode.

Among the above, second base member 6 is preferably formed of a flexible member such as a transparent resin film. The transparent resin film has a light-weight, is excellent in processability, and can achieve reduction of manufacturing cost. Furthermore, since it is made of an organic material, high reliability with respect to external stress such as bending can be obtained. Accordingly, the flexibility is improved, and thus element 31 can be used for a curve shape rather than a flat shape.

In a conventional photoelectric conversion element as shown in FIG. 5, adhesion between first electrode layer 13 and photoelectric conversion layer 14 is low, so that sufficient reliability cannot be obtained in the interface between first electrode layer 13 and photoelectric conversion layer 14. In particular, when first electrode layer 13 is made of an inorganic material and photoelectric conversion layer 14 is made of an organic material, the adhesion between first electrode layer 13 and photoelectric conversion layer 14 is low, and sufficient interface reliability cannot be obtained. In addition, when the photoelectric conversion element is required to have flexibility, long-term interface reliability becomes important.

Figure 2:
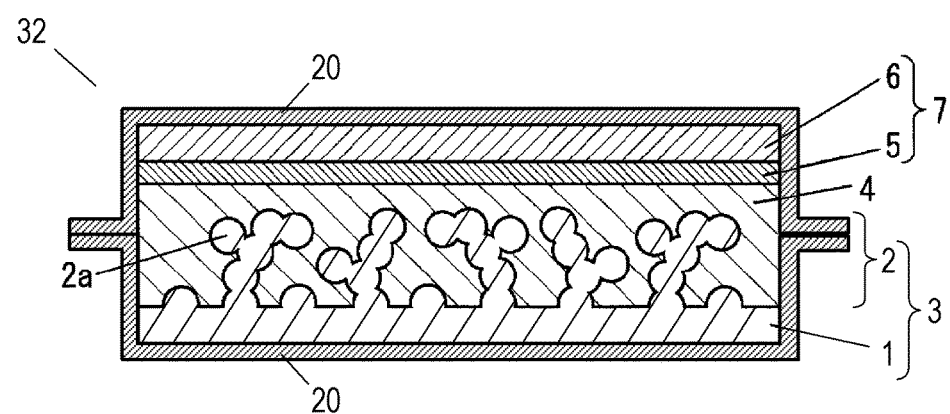
FIG. 2 is a schematic sectional view of another photoelectric conversion element in accordance with the first exemplary embodiment of the present invention.

After second electrode layer 7 is formed, pressure is applied from at least one of the upper and lower surfaces of element 31. Thus, a post-treatment process can be carried out. Alternatively, as shown in FIG. 2, photoelectric conversion element (hereinafter, referred to as element) 32 may be formed by sealing a laminated body having the same structure as that of element 31 in insulative package member 20 in a decompressed state. The layers are formed individually and pressurized finally, or sealed in package member 20 as a vacuum pack, thereby enabling the layers to be bonded to each other and a function as an electron device to be enhanced. Note here that the degree of vacuum of the vacuum pack is preferably 100 Pa or less. As a result, adhesion between first electrode layer 3 and conversion layer 4 can be enhanced, and the bonding reliability at the interface between first electrode layer 3 and conversion layer 4 is improved. As mentioned above, it is preferable that rough layer 2 and conversion layer 4 are press-bonded. Such an effect of pressing or sealing in insulative package member 20 in a decompressed state is also effective when metallic first base member 1 whose surface is etched is used as the first electrode.

As mentioned above, in elements 31 and 32, an area of first electrode layer 3 can be increased as compared with a conventional case in which etching treatment is carried out. A contact interface between rough layer 2 including metal fine particles 2a and conversion layer 4 can be made extremely large. Furthermore, since rough layer 2 has a special structure including connected bodies 2b each made of metal fine particles 2a irregularly connected together, an area of the electrode can be increased and photoelectric conversion efficiency can be enhanced by the surface plasmon absorption effect. Furthermore, the contact interface between first electrode layer 3 and conversion layer 4 is increased, so that the mechanical strength of first electrode layer 3 itself and that of an interface between first electrode layer 3 and conversion layer 4 are improved, and the adhesion between first electrode layer 3 and conversion layer 4 is improved. Furthermore, the ability to follow bending is improved. Therefore, elements 31 and 32 can have high reliability for a long period of time.

Second Exemplary Embodiment

Figure 3:
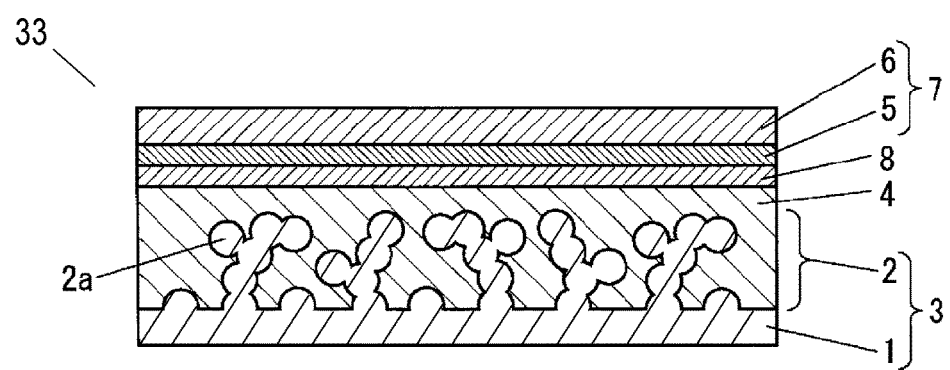
FIG. 3 is a schematic sectional view of a photoelectric conversion element in accordance with a second exemplary embodiment of the present invention.

FIG. 3 is a schematic sectional view of photoelectric conversion element (hereinafter, referred to as element) 33 in accordance with a second exemplary embodiment of the present invention. Element 33 includes positive-hole transport layer (hereinafter, referred to as transport layer) 8 at an interface between conversion layer 4 and conductive layer 5 in the structure of the first exemplary embodiment shown in FIG. 1. That is to say, element 33 includes transport layer 8 between conversion layer 4 and conductive layer 5. Other configurations are the same as those in the first exemplary embodiment.

When transport layer 8 is provided, transport layer 8 that is brought into contact with conversion layer 4 makes movement of electric charges from conversion layer 4 to conductive layer 5 smooth. Accordingly, it is possible to improve an efficiency of extracting electric charges (positive holes). As a result, the photoelectric conversion efficiency can be improved.

Note here that, in FIG. 3, transport layer 8 is formed on the whole surface of conversion layer 4, but may be formed on at least a part of conversion layer 4. Transport layer 8 is brought into direct contact with both conversion layer 4 and conductive layer 5.

In element 33, since light enters conversion layer 4 through second electrode layer 7 and transport layer 8, transport layer 8 has light transmission characteristics. Specifically, the total light transmittance of transport layer 8 is preferably 80% or more. Similarly, second electrode layer 7 preferably have the total light transmittance of 80% or more by using a transparent electrode or a mesh-like electrode for conductive layer 5.

Transport layer 8 is formed of a material capable of transporting positive holes. That is to say, the material used for transport layer 8 is not particularly limited as long as it satisfies the above-mentioned characteristics and can extract positive holes from conversion layer 4 to conductive layer 5 efficiently. Specifically, polyethylenedioxythiophene/polystyrene sulfonic acid (PEDOT/PSS) is preferable. Other than this, a conductive polymer material such as doped polyaniline, polyphenylene vinylene, polythiophene, and polypyrrole can be used.

It is preferable that transport layer 8 has a thickness in the range of nm or more and 600 nm or less. Too large thickness may increase volume resistance of the layer.

Transport layer 8 can be formed by, for example, a wet coating method. A coating method is not particularly limited as long as transport layer 8 can be formed uniformly to have a predetermined thickness. Examples of the coating methods include a die coating method, a spin coating method, a dip coating method, a roll coating method, a bead coating method, a spray coating method, a gravure coating method, an ink-jet method, a screen printing method, and the like. After transport layer 8 is formed on at least a part of an upper surface of conversion layer 4, conductive layer 5 is formed and then second base member 6 is disposed thereon by the same methods as in the first exemplary embodiment. Thus, element 33 can be produced.

Third Exemplary Embodiment

Figure 4:
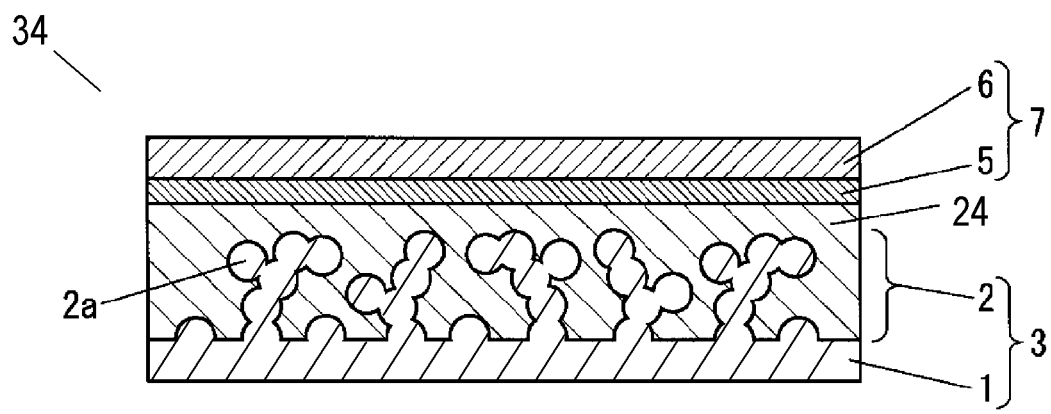
FIG. 4 is a schematic sectional view of a photoelectric conversion element in accordance with a third exemplary embodiment of the present invention.

FIG. 4 is a schematic sectional view of photoelectric conversion element (hereinafter, referred to as element) 34 in accordance with a third exemplary embodiment of the present invention. Element 34 includes photoelectric conversion layer (hereinafter, referred to as conversion layer) 24 instead of conversion layer 4 in the structure of the first exemplary embodiment shown in FIG. 1. When an electric field is applied between first electrode layer 3 and second electrode layer 7, electric charges (positive holes) which move from second electrode layer 7 to the inside of conversion layer 24 and electrons which are injected from conductive layer 5 to the inside of conversion layer 24 are combined to each other, so as to emit light. In this way, element 34 can convert electrical energy into light. Other configurations are the same as those in the first exemplary embodiment.

In this configuration, first electrode layer 3 plays a role of an electrode (electron-injection electrode) for injecting an electron into conversion layer 24. In element 34, light passes from conversion layer 24 to second electrode layer 7. Therefore, similar to the first exemplary embodiment, first electrode layer 3 is not necessarily required to be transparent.

Also in element 34, preferable ranges of the average particle diameter of metal fine particles 2a, the mode of the pore diameter of rough layer 2, the porosity of rough layer 2, the thickness of rough layer 2, and the like, are the same as those in the first exemplary embodiment.

Next, conversion layer 24 is described. Conversion layer 24 is formed so as to cover the whole surface of rough layer 2 formed on first base member 1 as shown in FIG. 4. Conversion layer 24 contributes to light emission of element 34, and has a function of combining electric charges generated by injection of electrons and positive holes from first electrode layer 3 and second electrode layer 7, respectively.

In FIG. 4, conversion layer 24 is shown as a single layer having both an electron acceptor function and an electron donor function. However, conversion layer 24 may be formed by laminating an electron acceptor layer having an electron-acceptor function and an electron donor layer having an electron-donor function. Hereinafter an example of conversion layer 24 made of a single layer is described.

Conversion layer 24 as a light-emitting layer contains an electron donor material and an electron acceptor material. Accordingly, since conversion layer 24 emits light by using electric charges to be recombined in conversion layer 24, conversion layer 24 functions alone as a light-emitting layer.

Specifically, it is preferable that polyparaphenylene is used as a light-emitting material. Other than this, an electron conductive polymer such as polyparaphenylenevinylene, poly(9,9-dialkylfluorene) can be used for conversion layer 24.

A thickness of conversion layer 24 preferably is a film thickness that is generally employed in polymer organic EL light-emitting element. Furthermore, in order to cover the whole part of rough layer 2, the thickness of conversion layer 24 is preferably larger than a thickness of rough layer 2. Accordingly, it is preferable that the thickness of conversion layer 24 is in the range of 5 nm or more and 10.0 µm or less.

Note here that, as described in the first exemplary embodiment with reference to FIG. 2, it is preferable that pressure is applied from at least one of the upper and lower surfaces of element 34 after second electrode layer 7 is formed, or that a laminated body which is the same as that of element 34 is sealed in insulative package member 20 in a decompressed state. By any one of these methods, respective layers can be bonded to each other and the function as an electron device can be enhanced. As a result, as compared with a conventional element, element 34 with high luminance can be produced.

As mentioned above, in element 34, as compared with a conventional element, an electrode area can be increased, and a contact interface between rough layer 2 including metal fine particles 2a and conversion layer 24 can be extremely increased. As a result, mechanical strength of first electrode layer 3 itself and that of the interface between first electrode layer 3 and conversion layer 24 are improved, and the adhesion therebetween is improved. Furthermore, the ability to follow bending is improved. Therefore, element 34 can have high reliability for a long period of time. Furthermore, by controlling the area of first electrode layer 3 and the thickness of rough layer 2, loss of surface plasmon is reduced. Thus, light can be extracted with higher efficiency, and luminance of element 34 can be increased.

Note here that rough layer 2 and conversion layer 24 may be press-bonded by sealing a laminated body having the same configuration as that of element 34 in insulative package member 20 in a decompressed state as shown in FIG. 2, or rough layer 2 and conversion layer 24 may be press-bonded by application of pressure.

INDUSTRIAL APPLICABILITY

A photoelectric conversion element in accordance with the present invention has features of having a large electrode area and high efficiency (high luminance). Furthermore, the photoelectric conversion element in accordance with the present invention has strong mechanical strength and high reliability, and is applicable for applications which require flexibility, and the like.

The invention claimed is:

1. A photoelectric conversion element comprising:
a first electrode layer including a first base member and a rough layer formed on the first base member;
a photoelectric conversion layer formed on the rough layer; and
a second electrode layer formed above the photoelectric conversion layer,
wherein the rough layer is formed of a plurality of metal fine particles irregularly connected together and to a surface of the first base member,
the rough layer has a surface roughness which is rougher than that of the second electrode layer, the rough layer includes a plurality of connected bodies each formed of a part of the plurality of metal fine particles and pores formed between the plurality of connected bodies, the photoelectric conversion layer infiltrates in the pores, a bottom portion of each of the plurality of connected bodies is connected to the first base member and a tip portion of each of the plurality of connected bodies is apart from the first base member, the bottom portion being located closer to the first base member than the tip portion, a diameter of a metal fine particle disposed at the bottom portion of each of the plurality of connected bodies is larger than a diameter of a metal fine particle disposed at the tip portion of each of the plurality of connected bodies, a mode of diameters of the pores in the rough layer is 5 nm or more and 1 μm or less before the photoelectric conversion layer infiltrates the pores, and the porosity of the rough layer ranges from about 50% to 80%.

2. The photoelectric conversion element according to claim 1, wherein each of the connected bodies has a structure diverging into a plurality of branches.

3. The photoelectric conversion element according to claim 1, wherein a mode of a diameters of the plurality of metal fine particles is 5 nm or more and 300 nm or less.

4. The photoelectric conversion element according to claim 1, wherein the second electrode layer is any one of a transparent electrode, a metal mesh wiring electrode, and a metal nanowire electrode.

5. The photoelectric conversion element according to claim 1, wherein the rough layer and the photoelectric conversion layer are pressure-bonded.

6. The photoelectric conversion element according to claim 5, further comprising an insulative package member sealing, in a decompressed state, a layered body formed of the first electrode layer, the photoelectric conversion layer, and the second electrode layer, wherein the rough layer and the photoelectric conversion layer are pressure-bonded by the package member.

7. The photoelectric conversion element according to claim 1, further comprising a positive-hole transport layer formed between the photoelectric conversion layer and the second electrode layer.

8. The photoelectric conversion element according to claim 1, wherein the photoelectric conversion layer is a single layer.

9. The photoelectric conversion element according to claim 8, wherein the photoelectric conversion layer wholly fills the pores between the plurality of connected bodies.

10. The photoelectric conversion element according to claim 3, wherein a diameter of each of the connection portions is 30% or more with respect to the diameters of the plurality of metal fine particles.

* * * * *